US006711189B1

United States Patent
Gilliland et al.

(10) Patent No.: US 6,711,189 B1
(45) Date of Patent: Mar. 23, 2004

(54) AUTOMATIC POWER CONTROL AND LASER SLOPE EFFICIENCY NORMALIZING CIRCUIT

(75) Inventors: Patrick B. Gilliland, Chicago, IL (US); Luis Torres, Schaumburg, IL (US); Evgueniy Anguelov, River Grove, IL (US); Mike A. Ward, Chicago, IL (US)

(73) Assignee: Stratos Lightwave, Inc., Chicago, IL (US)

( * ) Notice: Subject to any disclaimer, the term of this patent is extended or adjusted under 35 U.S.C. 154(b) by 0 days.

(21) Appl. No.: 09/498,221

(22) Filed: Feb. 4, 2000

(51) Int. Cl.[7] .............................. H01S 3/13; H01S 3/00; G05F 3/00; H04B 10/04
(52) U.S. Cl. .............................. 372/38.02; 372/29.021; 372/38.07; 359/180; 323/304
(58) Field of Search ................. 372/38.02, 38.07, 372/29.021; 359/180, 187; 323/304

(56) References Cited

U.S. PATENT DOCUMENTS 5,638,390 A    6/1997 Gilliland et al. ............... 372/38

FOREIGN PATENT DOCUMENTS

EP          0161496     * 11/1985

* cited by examiner

Primary Examiner—Frank G. Font
Assistant Examiner—Armando Rodriguez
(74) Attorney, Agent, or Firm—Steven M. Evans

(57) ABSTRACT

Automatic power control (APC) is provided by a) a variable output voltage differential receiver/driver, which receiver is responsive to data signals for generating a voltage, the laser driver output voltage amplitude being controlled by a first potentiometer on an integrated circuit generating an AC current signal for summing with a DC current signal to provide a laser drive current signal to b) a laser transmitter having a laser diode, said laser diode for producing optical power over an optical transfer medium and a photodiode for producing a feedback signal in response to said optical power, the APC including c) a power stabilizing circuit including an error amplifier, a second potentiometer and a bias current drive transistor, the error amplifier having inputs for both the feedback signal and a voltage reference to generate an output control signal, the second potentiometer affecting said output control signal, and said bias current drive transistor being responsive to said output control signal for supplying bias current to the laser diode. According to another aspect of the invention, one or more of the potentiometers, error amplifier or voltage reference are included on said integrated circuit.

27 Claims, 10 Drawing Sheets

AUTOMATIC POWER CONTROL AND LASER SLOPE EFFICIENCY NORMALIZING CIRCUIT

FIELD OF THE INVENTION

The present invention relates to optoelectronic transmitters, and more particularly to optoelectronic transmitters having automatic power control and biasing circuitry for driving semiconductor lasers.

BACKGROUND OF THE INVENTION

Optoelectronic transceiver modules provide an interface between an electrical system and an optical transfer medium such as an optical fiber. Correspondingly, most optoelectronic transceiver modules contain electrical and optical conversion circuitry for transferring data to and from the electrical system and the optical transfer medium.

Normally, transceiver modules use laser diodes which produce coherent light for performing high speed data transfers between the electrical system and the optical transfer medium. Typically, each laser diode is packaged with optical power-monitoring circuitry. For example, the HFE4081-321 diode package by Honeywell, Incorporated, contains both a laser diode for transmitting data and a photodiode for performing power-monitoring.

The power-monitoring photodiode within the diode packaging provides a monitor current $I_m$ which varies as the optical power being generated by the laser diode changes. Normally, the changes in the monitor current $I_m$ are directly proportional to the changes in the optical power generated by the laser diode. However, the ratio of monitor current $I_m$ with regard to the laser diode's optical power can vary widely from one diode package to the next. Therefore, each diode package must be tested individually in order to determine its specific ratio of monitor current $I_m$ to laser diode optical power.

The primary purpose of providing a monitor current $I_m$ is for ensuring that, during operation, the laser diode is lasing. The minimum current which must be supplied to the laser diode to cause lasing is the threshold current $I_{th}$.

When the current being supplied to the laser diode is less than the threshold current $I_{th}$, the laser diode is operating in the LED mode. In the LED mode, the current supplied to the laser diode is only sufficient to excite atoms in the laser diode's cavity which cause light to be emitted similar to that produced by light emitting diodes (LEDs).

When the current supplied to the laser diode reaches a level greater than or equal to the threshold current $I_{th}$, the laser diode's efficiency of converting electrical current into light will increase dramatically and thus the laser diode changes from the LED mode of operation to the lasing mode of operation.

Referring to the drawings, FIG. 1 illustrates typical output power versus input current curves, or P-I curves, for three individual semiconductor lasers A, B and C. One of the primary difficulties with semiconductor lasers is that each individual laser has its own unique set of output characteristics. In FIG. 1, the horizontal axis (I) represents the drive current input to the semiconductor laser, and the vertical axis (P) represents the corresponding optical output power delivered by the laser. As can be seen, a uniform DC input current $I_Q$ supplied to each of the individual semiconductor lasers A, B and C results in a different amount of optical output power, $P_{QA}$, $P_{QB}$, and $P_{QC}$, being delivered by each of the lasers.

Furthermore, since the linear operating range for each semiconductor laser has a different slope, a given change in the input current $\pm \Delta I$ will cause a different change in the output power $\pm \Delta P$ for different semiconductor lasers.

These variations in the slope efficiency of the semiconductor lasers can be seen in FIG. 1. The uniform DC operating current, or quiescent current, $I_Q$ is applied to each of the three lasers A, B, and C, and an identical alternating current signal $I_{SIG}$ is superimposed thereon wherein $I_{sig} = I_Q \pm \Delta I$. $I_{SIG}$ causes a periodic change in the input current $\pm \Delta I$ above and below the quiescent current $I_Q$. The magnitude of the $\Delta I$ applied to each semiconductor laser in FIG. 1 is identical between the three semiconductor lasers A, B, and C. On the output side, however, the resultant changes in the output power $\pm \Delta P_A$, $\pm \Delta P_B$ and $\pm \Delta P_C$ generated due to the changes in the input current vary from one laser to the other. As is clear in FIG. 1, $\Delta P_A$ is greater than $\Delta P_B$, and $\Delta P_B$ is greater than $\Delta P_C$. These variations in the output characteristics of individual lasers raise a significant barrier to designing a standard, reliable optoelectronic transmitter for mass production.

Ideally, each optoelectronic transmitter of a particular design will have similar output characteristics. The optical output of the transmitter is to represent a binary data signal comprising a serial string of 1's and 0's. A binary 1 is transmitted when the optical output of the transmitter exceeds a certain power threshold, and a binary zero is transmitted when the optical output power of the transmitter falls below a certain power threshold. Maximizing the difference in transmitted power levels between 1's and 0's improves the reliability of the transceiver and improves the signal-to-noise ratio at the receiver input at an opposite end of a data link. Thus, in a transceiver design incorporating a semiconductor laser as the active optical element, the transmitter should include provisions for optimizing the output characteristics of the semiconductor laser. Furthermore, these output characteristics should be the same from one transceiver to another. The IEEE standard for Gigabit Ethernet is an example of a standard for data communications over an optical fiber which requires such uniform transmitter characteristics. Therefore, the optimizing circuitry should also normalize the output characteristics of the transmitter to a well-defined standard.

In generating the optical output signal, the transmitter driver circuit receives a binary voltage signal from the host device. The driver circuit converts the input voltage signal to a current signal that drives the semiconductor laser. A signal voltage corresponding to a binary 1 must be converted to a current supplied to the semiconductor laser sufficient to cause the semiconductor laser to radiate an optical output signal having an output power level above the power threshold corresponding to the transmission of a binary 1. Similarly, a signal voltage corresponding to a binary 0 must be converted to a current level supplied to the semiconductor laser which will cause the semiconductor laser to radiate an optical output signal having an output power level below the power threshold corresponding to the transmission of a binary 0. However, due to variations in the P-I characteristics from one semiconductor laser to another, the current levels necessary to produce the desired output power levels will vary depending on the individual characteristics of each individual semiconductor laser. U.S. Pat. No. 5,638,390, issued to Gilliland et al., discloses a design and method for stabilizing an optoelectronic transceiver having a laser diode. U.S. Pat. No. 5,638,390 is hereby incorporated by reference.

In general, variations in the P-I characteristics of individual semiconductor lasers can be compensated for by employing bias and AC drive circuits which adjust the input current driving the semiconductor laser. There are two components to the laser control circuits. The first component, automatic power control (APC), involves establishing the average DC input current, or quiescent operating current $I_Q$. $I_Q$ establishes the average output power, or quiescent operating power $P_Q$ that will be radiated by the semiconductor laser. The second component, laser slope compensation, involves determining the change in the input current, $+\Delta I$, necessary to cause a desired change in the output power $\pm\Delta P$ to establish the optical power levels corresponding to digital 1's and 0's respectively.

FIG. 2 shows the identical P-I curves for semiconductor lasers A, B, and C as shown as in FIG. 1. However, rather than the same input current being applied to each device, diverse input currents $I_A$, $I_B$, and $I_C$ are applied to each semiconductor laser A, B, and C respectively, such that each laser emits approximately the same output power $P_Q$. APC and laser slope compensation are best described in conjunction with the P-I curves, as shown in FIG. 2. The optical power signal transmitted alternates above and below the quiescent output power $P_Q$. Binary 1's are represented as $P_Q+\Delta P$, and binary 0's are represented as $P_Q-\Delta P$. The ratio of power levels between 1's and 0's is the extinction ratio of the transmitter. A greater extinction ratio, meaning a higher ratio of the output power levels between transmitted 1's and 0's, results in improved receiver performance at the opposite end of the data link. Therefore, it is desirable to control $P_Q$ and $\Delta P$ to maximize the extinction ratio $R_E$. To maximize $R_E$ it is best to establish a quiescent operating power $P_Q$ near the midpoint of the operating range of the semiconductor laser. Once $P_Q$ has been established, the extinction ratio can be maximized by setting $P_Q+\Delta P$ as nearly as possible to the maximum output level of the semiconductor laser, and setting $P_Q-\Delta P$ as nearly as possible the lasing power threshold of the semiconductor laser as possible.

As is clear from FIG. 2, the quiescent input current $I_Q$, necessary to achieve the same, or nearly the same, quiescent output power $P_Q$, will vary depending on whether semiconductor laser A, B or C is employed. Automatic power control establishes the quiescent input current $I_Q$ so that the desired average output power $P_Q$ is radiated by the particular semiconductor laser employed in the transceiver. Thus, for the three semiconductor lasers A, B and C depicted in FIG. 2, the quiescent operating currents $I_{QA}$, $I_{QB}$, and $I_{QC}$ will each deliver an output power of approximately $P_Q$ from semiconductor lasers A, B, and C respectively. Determining the proper quiescent current $I_Q$ for a particular semiconductor laser involves individually testing the semiconductor laser and varying the input current supplied thereto until the desired output power is achieved. Once the quiescent current $I_Q$ has been determined, an AC drive current can be generated which will be superimposed on the average DC input current to the laser equal to $I_Q$.

Once the quiescent current has been established, it is necessary to compensate for the varying slopes of the P-I curves for the various semiconductor lasers. Because the slope of each P-I curve is different, the magnitude of change in the input current $\Delta I$ necessary to cause a desired change in the output power $\Delta P$ will vary from one semiconductor laser to another. Referring again to the P-I curves of FIG. 2, a laser current signal $I_{SIG}$ composed of the quiescent currents $I_{QA}$, $I_{QB}$, and $I_{QC}$ and the modulation currents $\Delta I_A$, $\Delta I_B$, and $\Delta I_C$ is supplied to each of the semiconductor lasers A, B, and C respectively. The peak magnitudes of the alternating current signals are represented by the quantities $\Delta I_A$, $\Delta I_B$, and $\Delta I_C$. Clearly, $\Delta I_C$ is greater than $\Delta I_B$, and $\Delta I_B$ is greater than $\Delta I_A$, yet for each semiconductor laser the corresponding change in the output power $\Delta P$ is approximately the same for each device. By controlling the peak magnitude of the input current signals $\Delta I_A$, $\Delta I_B$, and $\Delta I_C$, the laser signal currents $I_{SIG}$ can be tailored to the specific slope characteristics of a particular semiconductor laser such that the peak change in the output power $\Delta P$ can be set at or near the same levels even though the slope of the particular semiconductor laser may vary. This method produces a transmitter with consistent average power and extinction ratio.

Since the binary signals to be transmitted by the transceiver are optical representations of a voltage signal received from the host device, the driver circuit must convert the received voltage signal into a modulation current $\Delta I$ and superimpose $\Delta I$ onto the DC quiescent current $I_Q$. In tailoring the AC current signal to a particular semiconductor laser, a laser slope compensation circuit establishes the peak magnitude of $\Delta I$ resulting from changes in the input voltage signal. The slope compensated laser signal current $I_{SIG}$ will vary between $I_Q+\Delta I$ and $I_Q-\Delta I$, where $I_Q$ and $\Delta I$ have been calculated to provide the desired extinction ratio for the end application. Thus, for example, if semiconductor laser B of FIG. 2 is employed, the slope compensation circuit must supply $I_{SIGB}$ having peak values of $I_{QB}+\Delta I_B$ and $I_{QB}-\Delta I_B$, where the quantity $\pm\Delta I_B$ has been calculated to provide the correct change in output power $\Delta P$ of semiconductor laser B.

APC and laser slope compensation are generally accomplished through the adjustment or selection of resistors included within the laser control circuit. When the required quiescent current $I_Q$ and the proper magnitude of the slope compensated current signal $I_{SIG}$ have been determined, the resistors can be sized so the laser control circuit supplies the proper current signal to the semiconductor laser. APC and laser slope compensation help to normalize the output characteristics of the optoelectronic transceiver so individual transceivers may be used interchangeably without having a noticeable effect on the overall data communication system.

A problem with implementing APC and laser slope compensation, however, is they complicate the manufacturing process and add cost to the final transceiver product. Individually testing the output characteristics of each semiconductor laser is time consuming. Individually calculating the size of each resistor to optimize the output characteristics of each device is time consuming. What is more, having individualized components prevents the main transceiver printed circuit boards from being manufactured in a completely automated fashion. Instead, individual resistors must be sized and soldered in place by hand or potentiometers adjusted by skilled operators, adding time and cost to the manufacturing process. A less expensive method is desired for providing APC and laser slope compensation in optoelectronic transceiver modules where semiconductor lasers are employed as the active optical element. Variations in rise and fall times of a laser transmitter may be compensated for by using a variable capacitor to balance the effects of parasitic capacitance and adjust for the different rise and fall times of the given semiconductor laser diode.

In addition to APC and laser slope compensation, in some applications it is also advantageous to monitor the output power emitted by the semiconductor laser to ensure that the laser is operating within safe limits. Because the optical energy emitted by a semiconductor laser has the potential to be harmful to the eyes if transmitted with sufficient power, it is prudent to provide a mechanism for disabling the laser when the output of the laser exceeds safe operating levels. Such a mechanism should prevent the drive current from reaching the laser, and should provide a signal to the host device indicating that a laser fault has occurred.

SUMMARY AND OBJECTS OF THE INVENTION

The present invention is for normalizing the average power and peak power deviation of an optical output signal of an optoelectronic transmitter when coupled into an optical transmission medium such as an optical fiber by adjusting the output voltage of a laser driver to normalize output power characteristics of the transmitter. The normalization compensates for variations in the output characteristics of optical devices, and variations in optical coupling of output signals to a transmission media. The invention also allows for the variations in rise and fall times of a laser transmitter to be compensated for by the adjustment of a trimmer capacitor.

According to a first aspect of the present invention, an optical transmitter drive circuit including automatic power control (APC) and laser modulation is provided by a variable output voltage differential receiver/driver integrated circuit (IC) coupled to a semiconductor laser, wherein the receiver/driver is responsive to data signals for generating an output voltage. The output voltage is controlled by a first potentiometer, which may be a digital potentiometer, on an integrated circuit in order to generate an AC current signal for summing with a DC current signal to provide a laser drive current signal. The laser drive signal is received by a laser transmitter having a laser diode for producing optical power over an optical transfer medium and a photodiode for producing a feedback signal in response to said optical power. The automatic power control (APC) circuit includes an error amplifier, a second digital potentiometer and a bias current drive transistor, wherein the error amplifier has inputs for both the feedback signal and a voltage reference to generate an output control signal. The second digital potentiometer affects the output control signal, and the bias current drive transistor is responsive to the output control signal for supplying bias current to the laser diode. According to another aspect of the invention, one or more of the digital potentiometers, error amplifier or voltage reference is included on said integrated circuit.

According to another aspect of the invention, a laser fault detection and latching feature are on the same integrated circuit as the above-mentioned APC circuit and laser slope compensation control potentiometer. The laser fault detection feature monitors the output power of the laser and generates a fault signal when the output power exceeds a predetermined level. When an excess power fault is detected, the fault latching circuit disables the laser and sends a fault signal to a host device. The laser fault latching feature further includes laser fault reset and safe power up circuitry. The reset circuitry allows the laser fault condition to be cleared in a safe manner, such that the optical output of the semiconductor laser does not exceed safe operating levels. The power up circuitry disables the laser while determining the status of the control circuit during the initial application of the DC power supply. Once the integrity of the circuit has been determined, the laser is enabled. This feature allows for hot pluggability of a transceiver module so that the module may be safely installed in a system while the system is already operating.

These and other objects, features and advantages will become more apparent in light of the drawings and accompanying text.

DETAILED DESCRIPTION OF THE PREFERRED EMBODIMENT

Figure 3:
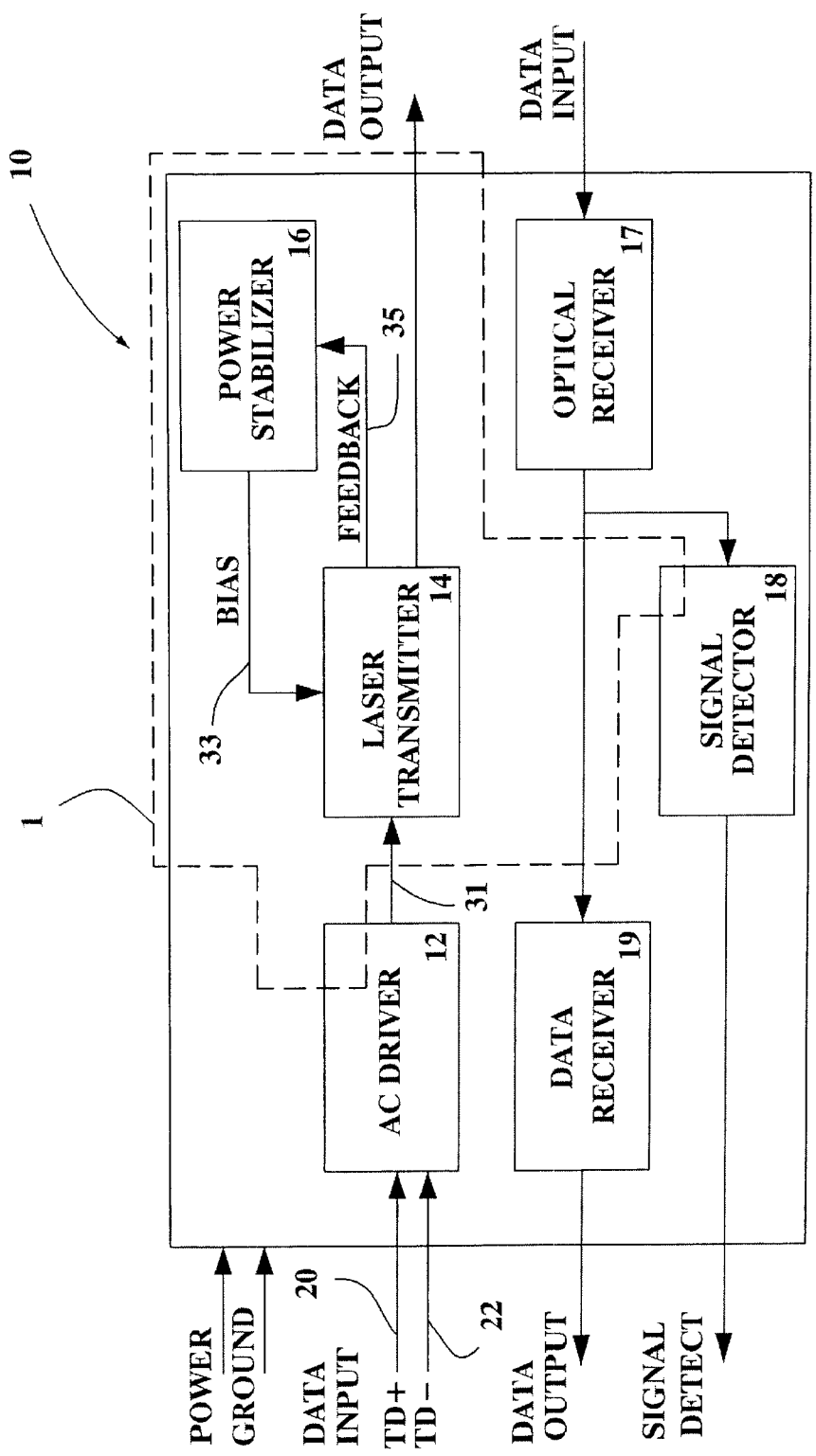
FIG. 3 is a functional block diagram of a transceiver module.

Turning to the drawings, FIG. 3 is a functional block diagram of a transceiver module 10 with an AC driver 12, laser transmitter 14, power stabilizer 16, optical receiver 17, signal detector 18, and data receiver 19. Within the functional block diagram a single block may indicate several individual circuits which collectively perform a single function. From this level of description, it would be clear to one of ordinary skill in the art, after perusal of the specification, drawing, and claims herein, how to make and use the invention, without undue experimentation. Dashed line 1 illustrates the components and sections of the transceiver module 10 that are being modified and improved by the present invention. The section enclosed by dashed line 1 is illustrated in detail in FIG. 4.

AC driver 12, laser transmitter 14, and power stabilizer 16 shown in FIG. 3 provide the electrical-to-optical conversion circuitry required to transfer data from an electrical system to an optical transfer medium. The AC driver 12 receives data input, in the form of electrical signals, and supplies a corresponding data signal to the laser transmitter 14 for transmittal onto the optical transfer medium. Furthermore, the laser transmitter 14 receives a bias signal from the power stabilizer 16 and transmits a corresponding monitor (i.e., feedback) signal in order to keep the laser transmitter 14 within the lasing mode of operation.

Turning to the portion of the transceiver module 10 which provides for optical-to-electrical signal conversion, the required circuitry consists of the optical receiver 17, signal detector 18, and data receiver 19 which are of standard construction. The optical receiver 17 is used to receive data signals, in the form of optical signals, from an optical transfer medium. The optical signals which are received by the optical receiver 17 are converted into electrical signals by conventional means such as a photodiode. The optical receiver 17 then transmits the electrical signals to both the data receiver 19 and the signal detector 18.

Furthermore, the electrical signals received by the signal detector 18 are used to provide a signal detect output which indicates when optical power is sufficient to allow for proper detection and conversion of optical signals into electrical data by the transceiver 10. Likewise, the signals received by the data receiver 19 are processed for transmission as data output, in the form of electrical signals.

Figure 4:
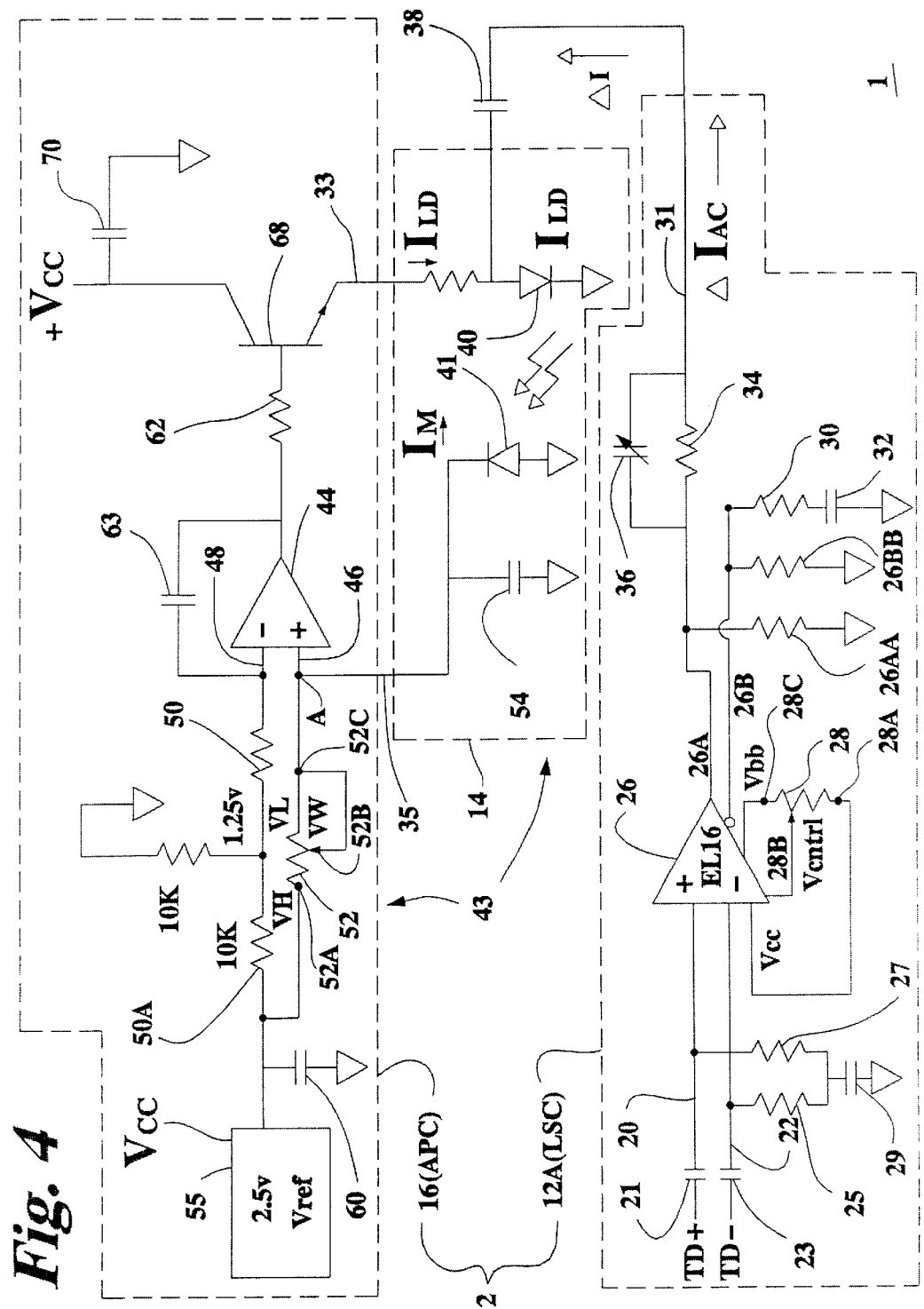
FIG. 4 is a circuit diagram according to the automatic power control and laser slope efficiency compensation circuit of the present invention.

FIG. 4 illustrates an automatic power control (APC) 16 in accordance with the present invention, which replace the conventional components of the power stabilizer 16 (FIG.

3). A laser slope efficiency compensation circuit (LSC) 12A in accordance with the present invention replaces a portion of the conventional components of the AC driver 12 (FIG. 3). Circuit 14 illustrates the components of the laser transmitter 14 (FIG. 3). The APC 16 and the LSC 12A form a discrete circuit assembly 2. Circuit 1 includes a pair of data signals TD+TD− on lines 20, 22 which enter a variable voltage driver 26, such as the Arizona Microtek AZM100EL16VS. Both of the differential inputs TD+ and TD− are provided with blocking capacitors 21 and 23, respectively, which provide for the AC coupling of the input signal paths associated with the differential receiver/driver 26. Furthermore, each of the input signal paths to receiver/driver 26 is connected to resistors 25 and 27, respectively, which have their opposite ends connected to a grounded capacitor 29. Resistors 25, 27 and the capacitor 29 provide for AC termination of the input signals TD+ and TD−.

Figure 10:
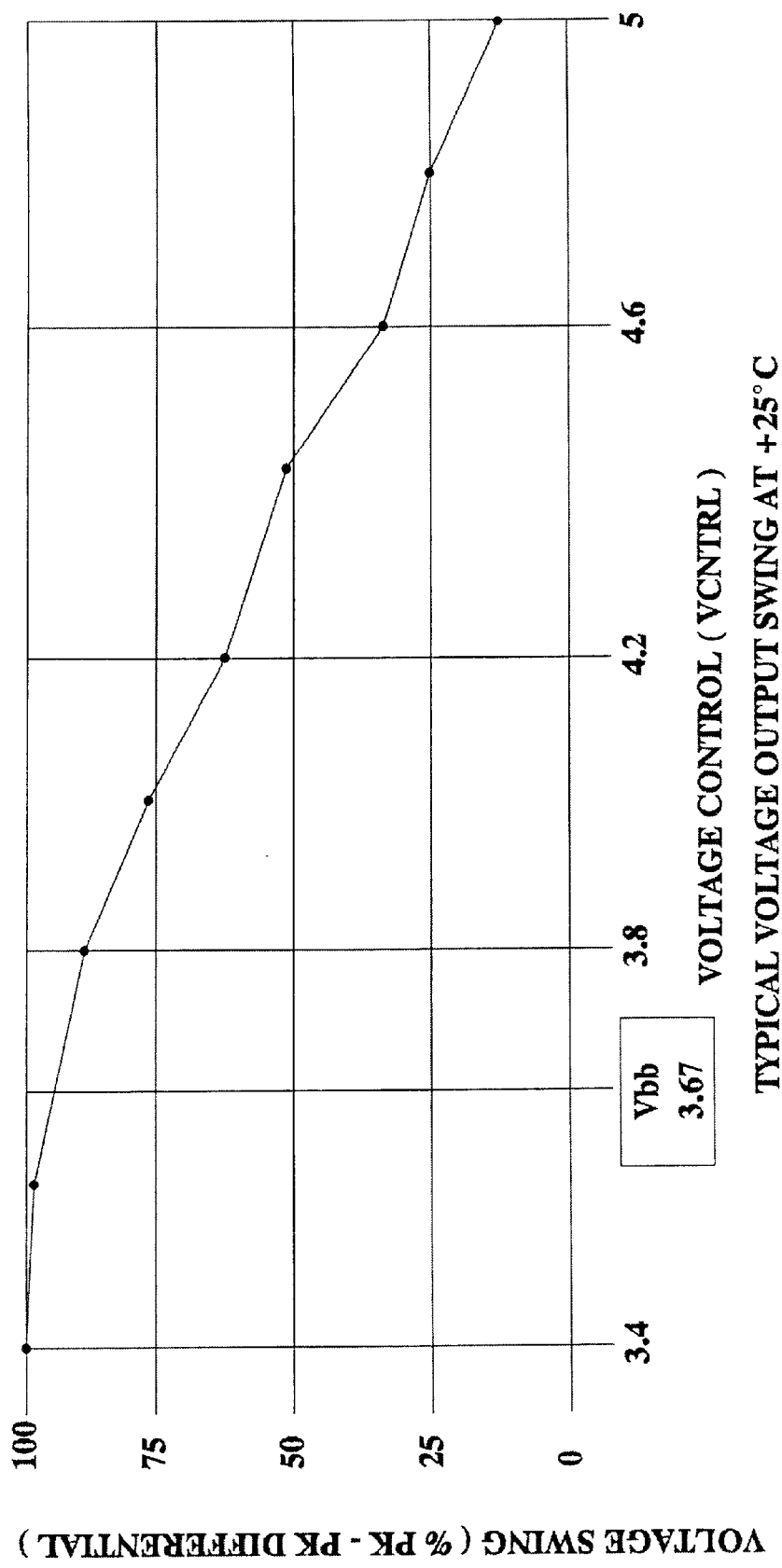
FIG. 10 is a graph illustrating the voltage swing for the variable output voltage driver in percentage peak-to-peak differential as a function of the control voltage.

The differential receiver/driver 26 is connected to a first digital potentiometer 28. First digital potentiometer 28 is connected to differential receiver/driver 26 between nodes (Vcc) 28A and (Vbb) 28C. The center tap of this first digital potentiometer 28 is connected to the Vcntrl input 28B. By adjusting the position of the center tap, the voltage at the Vctrl input can be varied between Vcc and Vbb. The PECL (positive emitter coupled logic) levels in use for this receiver/driver amplifier are 3.1 to 4.1 VDC when Vcc=5 VDC and the negative supply is signal ground. The voltage Vbb 28C is at the middle of the input logic level voltage range. When Vcc=5 VDC and the negative supply is signal ground, Vbb equals approximately 3.6 VDC. The accompanying control curve shown in FIG. 10 illustrates the relationship between Vctrl and the output voltage swing at the differential receiver/driver outputs 26A, 26B. Of course, the differential driver/receiver 26 must also be connected to power (Vcc) and ground. The $Q_{NOT}$ output of the receiver 26B is tied to resistor 30 and grounded capacitor 32. The open emitter output 26B of receiver/driver 26 is biased through resistor 26BB to ground. The open emitter output 26A of receiver/driver 26 is biased through resistor 26AA to ground. The Q output 26A is connected to resistor 34 and capacitor 36 in parallel, which resistor and capacitor are connected in series with capacitor 38. Capacitor 36 is placed in parallel with resistor 34 to balance the parasitic capacitances associated with circuit board traces, laser diode junction capacitance, etc. In the preferred embodiment, capacitor 36 is a variable capacitor. By employing a variable capacitor in parallel with resistor 34, variations in rise and fall times of individual laser diodes can be compensated for by adjustment of the 1.5–6.0 pF trimmer capacitor. Further, the opposite end of capacitor 38 is tied to the anode of laser diode 40. The combination of resistor 34, capacitor 36, capacitor 38 converts the variable voltage provided from receiver output 26A into a variable AC current for driving laser diode 40. The series capacitor 38 on signal line 31 AC couples the data signal and allows for the data signal to be added to the DC bias current on line 33, providing for optical power modulation without causing the laser diode 40 to undergo a change in average operating power or revert to LED mode.

Connected to the anode of the laser diode 40 is a bias current on line 33 from the APC 16. The bias current ensures that the laser diode 40 operates in the lasing mode. The APC 16 generates the bias current signal. In addition, the APC 16 requires a monitor current signal $I_m$ from the laser diode 40. The cathode of the laser diode 40 is grounded with the anode of photodiode 41. Thus, the reverse biased photodiode 41 provides the monitor current $I_m$ to the APC 16.

The APC 16 monitors the feedback signal $I_m$ provided by the photodiode 41 and produces the proper bias current on line 33 to the laser diode 40. The APC 16 uses an operational amplifier 44 such as the LMV321 (i.e., "op amp"), configured to operate like an error amplifier/integrator, which compares the voltage drop produced by $I_m$ across second digitally controlled potentiometer 52 with the 1.25V drop across resistor 50A. The output of the op amp 44 provides a signal which controls the bias current supplied on line 33 to the laser diode 40. Thus, when the output voltage of the op amp 44 decreases, the bias current on line 33 to the laser diode 40 decreases. Likewise, when the output voltage of the op amp 44 increases, the bias current on line 33 to the laser diode 40 is increased.

Attached to the non-inverting input 46 and inverting input 48 of the op amp 44 are resistors 52 and 50, respectively. One end 52A of potentiometer 52 is connected to a +2.5 voltage reference 55. Capacitor 60 is connected to the output of 2.5 Volt reference 55 in order to de-couple the AC component from the 2.5 Vref 55 signal. The wiper 52B and the other end 52C of digitally controlled potentiometer 52 is attached to the non-inverting input 46 of the op amp 44 and to the monitor current signal $I_m$ from the photodiode 41, along with a filter capacitor 54 which is grounded. The capacitor 54 provides for the removal of high frequency modulation in the signal current on line 31 provided by the receiver/driver 26, via capacitor 38, and provides for a "soft start" by delaying the increase in voltage at point "A" during initial power on. This ensures that the voltage at inverting input 48 of op amp 44 will be greater than the voltage at non-inverting input 46 of op amp 44 immediately after power is applied. This condition will drive the output of op amp 44 to its negative limit, ensuring there will be no current applied to laser diode 40 during the period immediately following the initial power up sequence. Thereafter, capacitor 54 ensures the op amp 44 will only respond to changes in the average value of the monitor current $I_m$ and thus the capacitor 54 removes the effect of the AC portion of the optical signal detected by the monitor photodiode 41.

The feedback signal $I_m$ generated by the photodiode 41 will cause a voltage drop across potentiometer 52. The voltage at point "A" will be the 2.5 VDC reference minus the voltage drop across second digital potentiometer 52. When this drop equals 1.25V, the voltage presented at non-inverting input 46 of the op amp 44 will equal the voltage presented at the inverting input 48 of the op amp 44. When this is achieved, the control loop 43 will be operating at a steady state, or equilibrium condition. If the laser optical efficiency decreases due to aging or to an increase in temperature, the monitor diode current $I_m$ will decrease. The voltage drop across potentiometer 52 will then decrease. Therefore the voltage at non-inverting input 46 will increase above 1.25 VDC. An increase in the voltage presented at the non-inverting input 46 of op amp 44 will cause the output of op amp 44 to increase, since no change has occurred at the inverting input 48. This is true because voltage reference 55 is temperature compensated, and stable. The increase in output voltage of the op amp 44 causes an increase in the base current of NPN transistor 68. Transistor 68 may be a 2N2222. This increase in the base current supplied to transistor 68 is amplified by the β of the transistor and the current supplied to the laser diode 40 is increased proportionately. The increase in current to laser diode 40 produces an increase in optical power and the optical power incident on monitor photodiode 41 is increased. This causes an increase in monitor diode photocurrent $I_m$ which drops the voltage at point "A" back down to 1.25 $V_{DC}$.

Conversely, when the laser optical efficiency increases, perhaps due to a decrease in temperature, the loop 43 will react in the opposite manner. Additional optical power incident on monitor photodiode 41 will cause an increase in photodiode monitor current $I_m$, increasing the voltage drop across second digital potentiometer 52. This increase in monitor diode photocurrent $I_m$ reduces the voltage at non-inverting input 46 of op amp 44 below 1.25 VDC and the output of op amp 44 is then driven in the negative direction, thereby reducing the bias current supplied to the base of transistor 68. The ensuing decrease in laser diode current will reduce the optical power and the monitor diode 41 photocurrent $I_m$ will decrease, thereby raising the voltage at point "A" back to 1.25 $V_{DC}$ and returning the loop to the equilibrium condition.

In one embodiment, second digital potentiometer 52 is a digitally controlled potentiometer which operates as a resistor array consisting of 99 resistive elements with tap points located between each resistive element and accessible by the wiper. The AC output voltage control potentiometer 28 may also be a similar digitally controlled potentiometer.

Referring once again to the output of op amp 44, the output of op amp 44 is connected to a current limiting resistor 62 which is connected to the base of an NPN transistor 68. The NPN transistor 68 acts as a current amplifier to give a boost to the otherwise limited current driving capability of the op amp 44. The collector of transistor 68 is connected to +5 $V_{DC}$ supply. A power supply decoupling capacitor 70 provides filtering of the +5 volts supplied to the collector of transistor 68. In addition, the emitter of the NPN transistor 68 provides the bias current to the laser diode 40.

Before the laser transmitter 1 is ready to begin transmitting data, the bias current on line 33 to the laser diode 40 must be set. The laser diode 40 output power level is set by adjusting the resistance of the second digital potentiometer 52. In one embodiment, the second digital potentiometer 52 is a digitally controlled potentiometer such as the Xicor X9C103.

Figure 5:
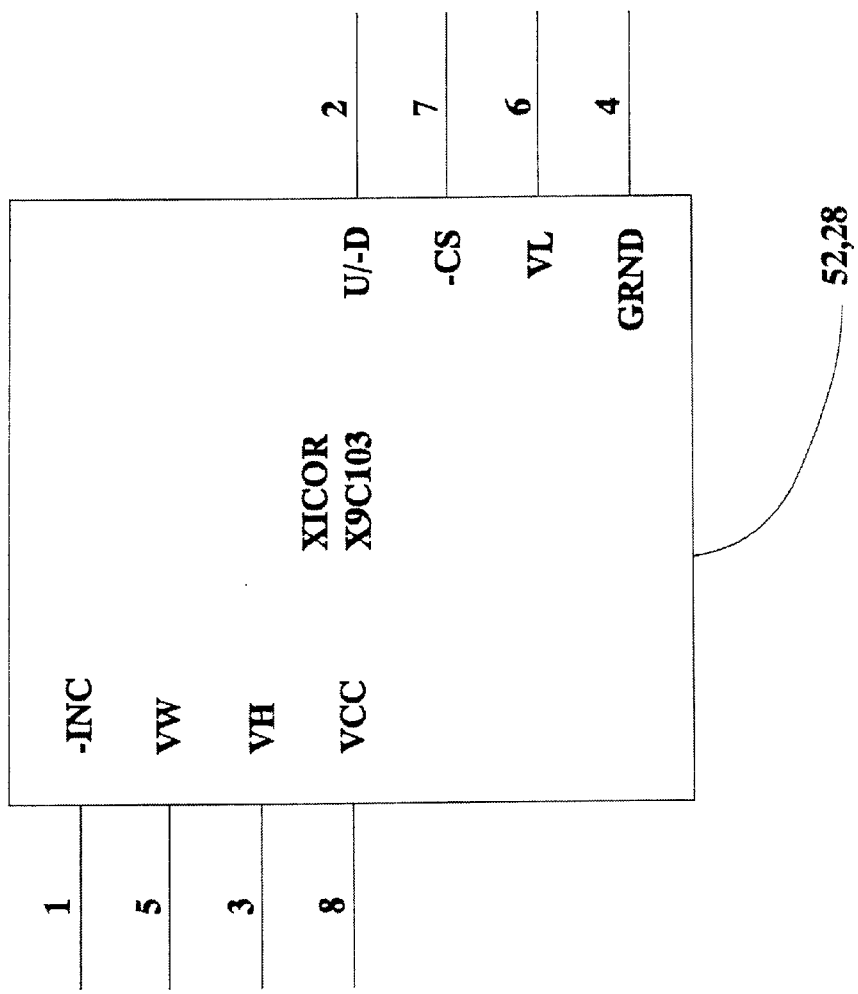
FIG. 5 is a block diagram of a nonvolatile digital potentiometer used in the present invention.

FIG. 5 is a block diagram of digital potentiometers 28 and 52. To adjust the wiper resistance of the second potentiometer 52, the device is selected by pulling the potentiometer's chip select –CS input (pin 7) to a low logic level. Once the –CS input is pulled low, the –INC input (pin 1) is toggled to either increase or decrease the resistance at the wiper terminal VW, while the output power of the laser diode 40 is monitored by a calibrated power meter. The resistance of potentiometer 52 is increased by pulling the U/–D input (pin 2) to a high logic level and, conversely, the resistance is decreased by pulling the U/–D input to a low logic level. This procedure allows the operator to set the laser output power level via control of the second digital potentiometer 52.

In the preferred embodiment, the optical power output of the laser diode 40 is measured by conventional means as known by those persons skilled in the art. Further, since the optical power of the laser diode 40 corresponds to the control signal supplied by the APC 16, the second digital potentiometer 52 allows for the APC 16 to be adjusted so it provides a specific bias current which corresponds to the feedback $I_m$ at the desired optical power level.

Using the second digital potentiometer 52 to adjust the voltage developed by the monitor diode feedback current $I_m$, the APC 16 will eliminate the possibility of accidentally destroying the laser diode 40 and provide for a stable means of setting the laser output power. The laser output power can be effectively set since the resistance of the second digital potentiometer 52 cannot be adjusted without supplying toggled signals to the –INC input of the second digital potentiometer 52. Therefore, the monitor current feedback voltage, and thus the corresponding optical power output of the laser diode 40, cannot be accidentally adjusted since only deliberate steps will cause changes to the voltage level at point "A" due to the monitor current feedback voltage.

In addition, the use of a second digital potentiometer 52 allows for the automatic adjustment of the laser output power. Automatic adjustments can be accomplished by having a device, such as a calibrated optical power meter, receive the optical output power from the laser diode 40 and, based on the level of optical output power measured, a computer or microprocessor can control the second digital potentiometer 52 to increase or decrease the optical power output of the laser diode 40.

Operationally speaking, the APC 16 will increase or decrease the bias current supplied to the laser diode 40 depending, respectively, on whether the feedback signal $I_m$ supplied by the photodiode 41 is too low or too high. The feedback signal governs the non-inverting input 46 of the op amp 44. In addition, the monitor current feedback voltage at the non-inverting input of op amp 44 (i.e., the error input) is adjusted by changing the second potentiometer 52 as described above. Therefore, comparison of the feedback signal from node A and the reference input signal at the inverting input determines the output voltage level of op amp 44.

It should be noted that the bias current on line 33 supplied through the emitter of transistor 68 will only be gradually changed due to the integrator circuit established by the integrator resistor 50, capacitor 63 and the op amp 44.

When the correct average power is established by second digital potentiometer 52, the AC driver 26 and laser diode 40 convert electrical data input signals into optical data output signals. Therefore, the optical power output of the laser diode 40 varies rapidly with the electrical signals received by the AC driver 26 and is transmitted as data over an optical medium.

FIG. 5, as discussed above, shows the first and second digital potentiometers 28, 52, which each have eight pins or inputs. Potentiometer 28 or 52 is a solid state nonvolatile potentiometer and is ideal for digitally controlled resistance trimming. The position of the wiper is controlled by pins –CS (7), U/–D (2), and –INC (1). Pins VH (3) and VL (6) are high and low terminals equivalent to the fixed terminals of a mechanical potentiometer. The high and low voltages are nominally plus five volts and ground, respectively. VH (3) and VL (6) refer to the relative position of the terminal in relation to wiper movement direction selected by U/–D (2) and not the potential on the terminal. Pin VW (5) is the wiper terminal equivalent to the movable terminal of a mechanical potentiometer; and the position of the wiper within the array is determined by the control inputs. The up/down control U/–D (2) controls the direction of the wiper movement and whether the counter in digital potentiometer 28 or 52 is incremented or decremented. The –INC (1) input is negative edge triggered. Toggling –INC (1) will move the wiper and increment or decrement the counter in the direction indicated by the logic level on the U/–D (2) input. The device is selected when the –CS (7) input is low. The present counter value is stored in nonvolatile memory when –CS (7) is returned high while the –INC (1) input is also high.

Figure 6:
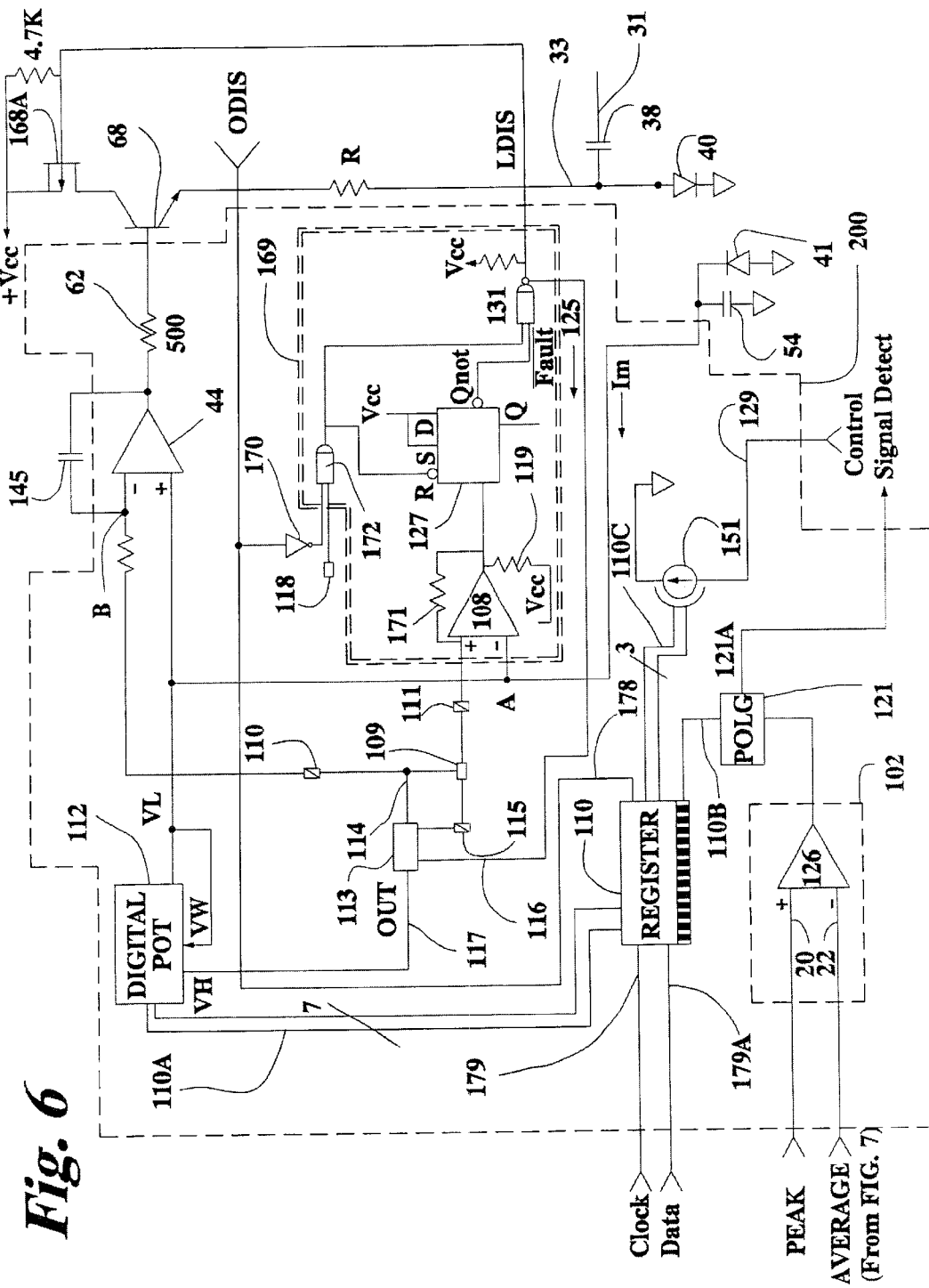
FIGS. 6–8 are circuit diagrams of the automatic power control and laser slope compensation circuit of the present invention.
Figure 7:
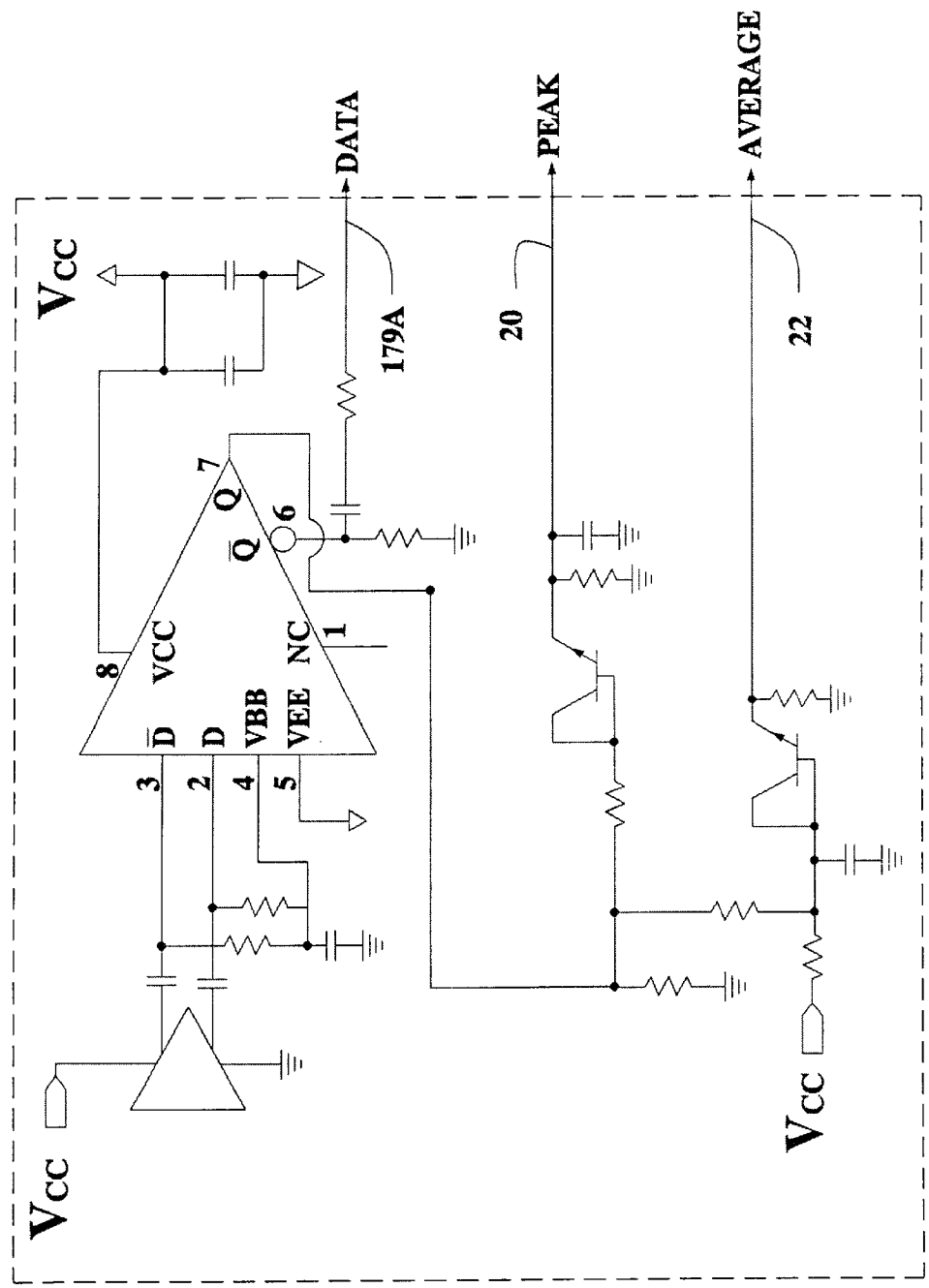
Figure 8:
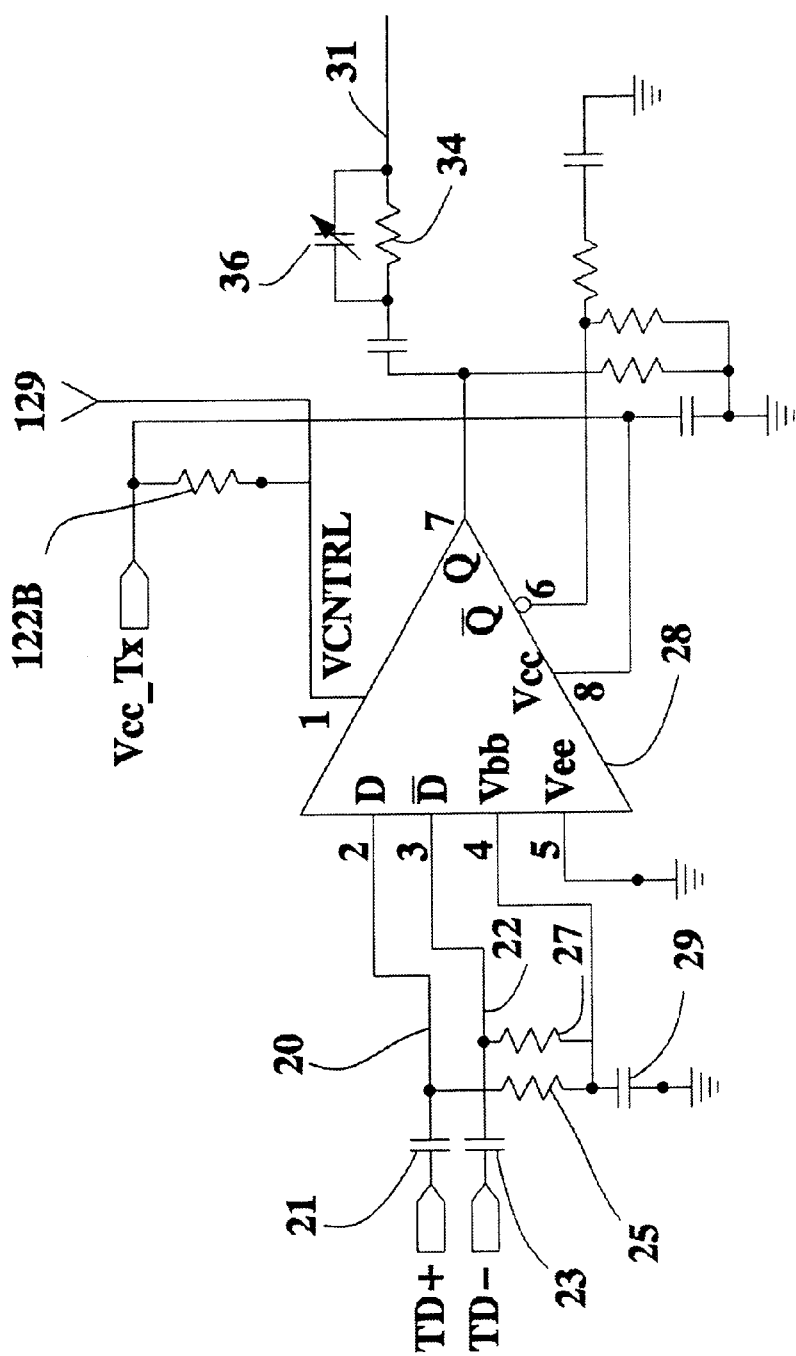

FIGS. 6–8 show a circuit that integrates the APC 16 (FIG. 4), the variable voltage control for the variable AC current drive 28 (FIG. 4), a signal detect decision circuit 102 (FIG. 6), and laser fault detection and latching circuitry 169 (FIG. 6). The signal detect decision circuit of FIG. 6 includes a comparator 126 responsive to an average power signal on line 22 provided to its inverting input and peak power on line 20 on its non-inverting input and a programmable output logic gate (POLG) 121. FIG. 7 shows the optical receiver circuitry which creates these signals. A valid signal is determined when the signal detect decision circuit 102 compares 20 and 22 and the peak signal 20 exceeds the average signal 22 by a preset margin. The output 121A of the signal detect comparator 126 can be programmed to either TTL or ECL logic levels by a single bit of an on board EEPROM of register 110 via control line 110B.

The register 110 is responsive on a line 179 to a clock signal and a line 179A to a data signal for filling register 110 with 11 bits which for convenience will be referred to as a word. The word is clocked into register 110 and provided as seven parallel inputs to a first digital potentiometer 112 via control lines 110A. Three parallel inputs 110C are provided to a second digitally controlled potentiometer which sets the value of the current sunk by current sink 151. The remaining bit 110B of the eleven is provided to a programmable logic level signal detect circuit. The bus to the digital potentiometer 112 is 7 bits wide and the bus to the digitally controlled current sink 151 is 3 bits wide. One bit selects either TTL or ECL logic level output at circuit 121 for the signal detect circuit. The width of these buses was selected based on the desired resolution of APC 16 and LSC 12A. Digitally controlled current sink 151 is connected on line 129 to the $V_{CNTRL}$ input of a variable voltage differential receiver/driver 126 and denoted as pin 1 in FIG. 8. The use of a current sink in the integrated circuit version of the LSC 12A circuit is dictated by the inability of the integrated circuit to source a voltage close to the positive supply. In this version of the circuit, the first digital potentiometer 28 is used to program current sink 151 which acts together with pull-up resistor 122B to adjust the voltage at the $V_{CNTRL}$ input as shown in FIG. 8. By varying the voltage at the $V_{CNTRL}$ input, the modulation current $I_m$ to the laser diode 40 can be changed as required to produce an optimum extinction ratio.

Figure 1:
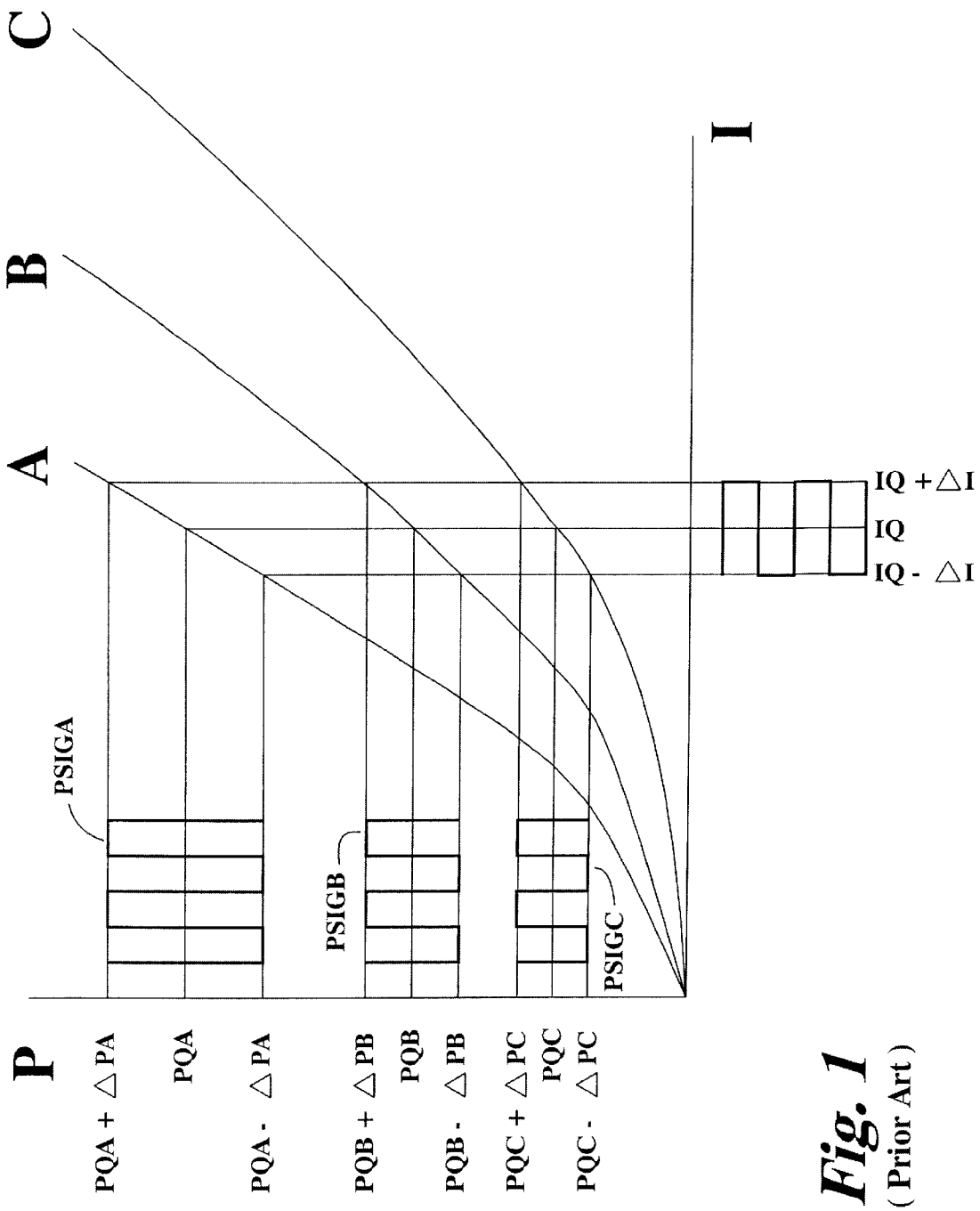
FIG. 1 is a plot of P-I curves for different lasers.
Figure 2:
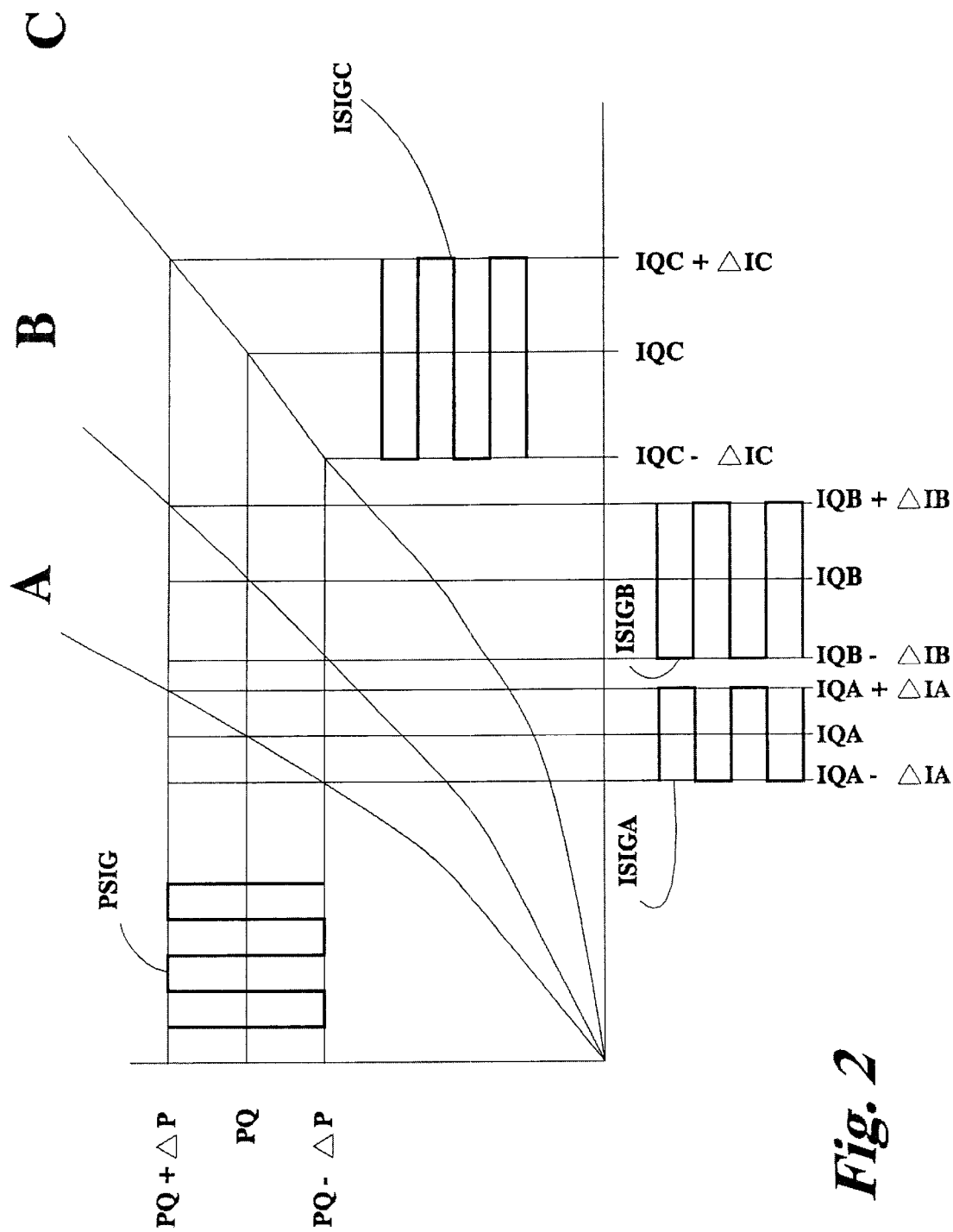
FIG. 2 is a plot of P-I curves for different lasers illustrating APC and laser slope efficiency compensation (LSC).

A digital potentiometer 112 controls the average power setpoint (PQ (FIG. 2)). In the integrated circuit embodiment of FIG. 6, the digital potentiometer 112 is controlled by seven lines in parallel. Digital potentiometer 112 is connected to an analog switch 113 which provides a connection at line 114 directly to a 2.5 VDC reference voltage 109, or to a resistive voltage divider at input 115 which establishes a 1.14 $V_{DC}$ reference voltage. In one embodiment, the resistors are 5.6 Kohms and 4.7 Kohms, respectively. The normal position of the analog switch 113 connects input 114 to output line 117 during equilibrium conditions of the APC 16. The APC 16 anticipates an interruption of normal operation by an outside laser disable command (ODIS on line 178, for Output DISable) or by an internally detected and latched laser fault condition. When a laser fault or ODIS occurs, the output of NAND gate 131 generates a Laser Disable signal (LDIS) on line 125. The Laser Disable signal provides a fast disable through P channel MOSFET 168A by interrupting the current flowing to NPN transistor 168 in less than 1 microsecond. If no other action is taken, the monitor current $I_M$ through photodiode 40 will be interrupted. In this event, the voltage at point "A" which is the non-inverting input to the error amplifier 44 will increase to 2.5 $V_{DC}$, forcing the op amp 44 output to the positive voltage limit. This condition is undesirable because the output disable signal ODIS on line 178 may be removed at some point. If the error amplifier 44 output is left at the positive limit during a Laser Disable condition, when the ODIS signal on line 178 is removed, the fast enable through P channel transistor 168A will allow the bias current transistor 168 to temporarily pass a surge of current. This surge of current would cause a corresponding surge of optical power from laser diode 40. Laser safety dictates against this event. To keep the APC error amplifier/integrator 44 in a fail-safe condition during Laser Disable conditions, the analog switch 113 connects the 1.14 $V_{DC}$ voltage at 115 to the second digital potentiometer 112 which controls the laser diode average power setpoint. This ensures that the voltage at the non-inverting input (point A) of error amplifier 44 will be less than the voltage at the inverting input of op amp 44. With these conditions met, the error amplifier 44 output will decrease to the negative limit during a Laser Disable. With the error amplifier output at the negative limit, the restart caused by the removal of ODIS will be a ramping-up of the optical power, with the APC 16 in control. Alternatively, in the absence of fast disable transistor 168A, the analog switch may be used as a laser disable though the response time may be slower.

Between the inverting input of op amp 44 and its output is a 0.1 $\mu$F capacitor 145. In combination with the capacitor 145 and the 475 K ohm resistor R1 at the inverting input, the op amp 44 forms an integrating error amplifier. The series limiting resistor 62 is connected between the op amp output 44 and the base of transistor 68. The APC 16, including the integrated portion and the external elements shown in FIG. 4A, performs similarly to the description given for the APC 16 of FIG. 4, with the addition of the integrator soft start circuitry including the analog switch 113 and resistive voltage divider 115.

FIG. 6 also shows a laser fault latching circuit 169 delineated by the double dashed lines. Comparator 108 is connected to a resistive voltage divider 111 which is connected to a 2.5V reference 109. The resistive divider 111 is composed of a 10 KΩ series resistor and an 8.06 KΩ resistor in parallel to signal ground. The voltage at the non-inverting input of comparator 108 is therefore 1.12 $V_{DC}$. Since the reference voltage for the APC control loop is set at 1.25 $V_{DC}$ by resistive divider 110, the nominal voltage at point "A" (the inverting input to comparator 108) will also be 1.25 $V_{DC}$ when the APC loop is in control. If the power from laser diode 40 exceeds the average power set by the digital potentiometer 112, the voltage at point "A" will drop below 1.25 $V_{DC}$. This is because the monitor photodiode 41 will begin to generate excess monitor $I_m$ current over and above the desired setpoint current established by the relation $(R_{SET}) \times (I_M) = 1.25$ VDC where $R_{SET}$ is the resistance set by the digital potentiometer 112.

When the monitor diode photocurrent $I_m$ exceeds the setpoint current by a predetermined amount (in the preferred embodiment 10%), the voltage at point "A" will fall below 1.12$V_{DC}$, causing the comparator 108 to transition from the normal logic "low" output to a logic "high".

The laser fault latching circuitry 169 monitors the optical power emitted by the photodiode 41 to determine whether the output power exceeds safe operating levels for the laser 40. The excess output power situation is monitored because transmitting an excessive amount of laser power can raise safety issues for personnel working in the vicinity of the optoelectronic transmitter 202. The low power fault condition need not be monitored since there is no risk of injury to personnel, and a low power failure will become manifest in failed data transmissions. The fault monitoring circuitry 169 relies on the same feedback circuit comprising photodiode 40 and the voltage divider 110 established for APC 16.

The comparator 108 is an open collector device. When the input voltage on its non-inverting terminal exceeds that on the inverting terminal, the output of 108 is pulled up to +5V by pull-up resistor 119. In the integrated circuit realization of the fault latching circuit, the comparator 108 output may have active pullup. When the non-inverting terminal voltage drops below that of the inverting terminal, the output of comparator 108 is pulled to ground. Thus, when the voltage present at node A exceeds 1.12 volts, the output of comparator 108 will be pulled down to ground potential. This corresponds to safe operating condition for laser 40. When the output power of laser diode 40 increases to the point where the voltage applied to the inverting terminal of 108 drops below 1.12V, indicating that the APC control loop is out of control, the output of comparator 108 transitions from low to high, switching from near ground potential to near +5V. The power threshold where this transition occurs represents the maximum output power of laser 40 which the transmitter 202 will allow. The output transition from low to high of comparator 108 indicates a laser fault condition which disables semiconductor laser 40 via NAND logic gate 131 and FET switch 168A, thereby providing a safety circuit which protects against excessive laser emissions. Feedback resistor 171 adds hysteresis to provide output stability and prevent chattering when the input voltages are near transition.

The output of comparator 108 is connected to the CLK input of D flip-flop 127. Inputs S and D of the flip-flop 127 are connected to the +5V $V_{CC}$. This +5V applied to the S input effectively disables the set feature of the flip-flop 127. A +5V level applied to the D input of 127 represents a logical 1. Thus, when the CLK input transitions from low to high (indicating that a laser fault has been detected), a logic 1 (+5V) is clocked through to the Q output, and a logic 0 (ground potential) is set on the output $Q_{NOT}$. As will be discussed in more detail below, a low $Q_{NOT}$ output from flip-flop 127 sets the $\overline{FAULT}$ signal to logic 0, and disables the laser 40.

The remaining input to flip-flop 127 is the $R_{NOT}$ input. When this input is set low (ground potential) a logic 0 is set on output Q and a logic 1 (+5V) is set on $Q_{NOT}$ $\overline{(FAULT)}$. The laser fault latching circuitry 169 providing the signal for this input includes a power on reset circuit 118 and an optical disable signal ODIS supplied by a host device. The power on reset circuit 118 generally supplies a logic 1 to the $R_{NOT}$ input. However, when the transceiver 1 is initially powered up, by initially powering up the entire system or hot plugging the transceiver into an already operating system, reset circuit 118 supplies a temporary logic 0 to the fault latching circuit 169. The low pulse serves two purposes. First, by providing a logic 0 input to $R_{NOT}$, the pulse resets flip-flop 127, setting output Q to logic 0 and $Q_{NOT}$ $\overline{(FAULT)}$ to logic 1, thereby unlatching any previous laser fault. Second, the low pulse from reset circuit 118 provides a logic 0 input to NAND gate 131. As will be discussed, a logic 0 on either input to NAND 131 disables laser 40. Therefore, the low pulse from 118 disables semiconductor laser 40 during the pulse, and clears the $\overline{FAULT}$ output (active low) $Q_{NOT}$ of flip-flop 127 setting it to a logic high level.

An ODIS signal on line 178 is generated external to the circuit in FIG. 6. When the ODIS signal on line 178 is set to a logic 1 the laser 40 is disabled, but a $\overline{FAULT}$ signal is not generated. Within the APC control circuit, the ODIS signal is connected to inverter 170. The output of inverter 170 is ANDed via AND gate 172 with the output of power on reset circuit 118 and input to the $R_{NOT}$ input of flip-flop 127. The same signal which is the logical "AND" of $ODIS_{NOT}$ and the power on reset circuit 118 is also connected to NAND gate 131. Thus, the inverted ODIS signal 170 affects the laser disable circuit 169 in the same manner as the logic 0 pulse supplied by the power on reset circuit does during power up. The ODIS signal at logic 1 indicates that a host device is commanding the transceiver to disable the laser 40. In such case, the inverted ODIS signal output from inverter (170) provides a logic 0 input to $R_{NOT}$ of flip-flop 127 which resets the flip-flop 127, setting output Q to logic 0 and $Q_{NOT}$ $\overline{(FAULT)}$ to logic 1, while simultaneously providing a logic 0 to the input of NAND gate 131 which disables the laser diode 40.

The output of NAND gate 131 disables semiconductor laser 40 when the NAND output 131 is a logic 1. The output of 131 will be a logic 1 if either of its inputs is logic 0. The first input to NAND 131 is connected to the logical AND of inverted ODIS signal 170 and the output of power on reset circuit 118. As discussed above, this input to NAND 131 will be logic 0 when the initial power up low pulse is delivered by 118 or the ODIS signal is set to logic 1 by the host device. The second input to NAND gate 131 is connected to the $Q_{NOT}$ output of flip-flop 127 $\overline{(FAULT)}$. This input will be logic 0 whenever the CLK input to flip flop 127 transitions from low to high indicating the presence of a laser fault. Thus, in addition to the conditions described above regarding the power on reset circuit 118, and the ODIS signal, the output of NAND gate 131 will also disable laser 40 when the laser fault circuitry 169 detects excess power emitted from the laser 40.

Figure 9:
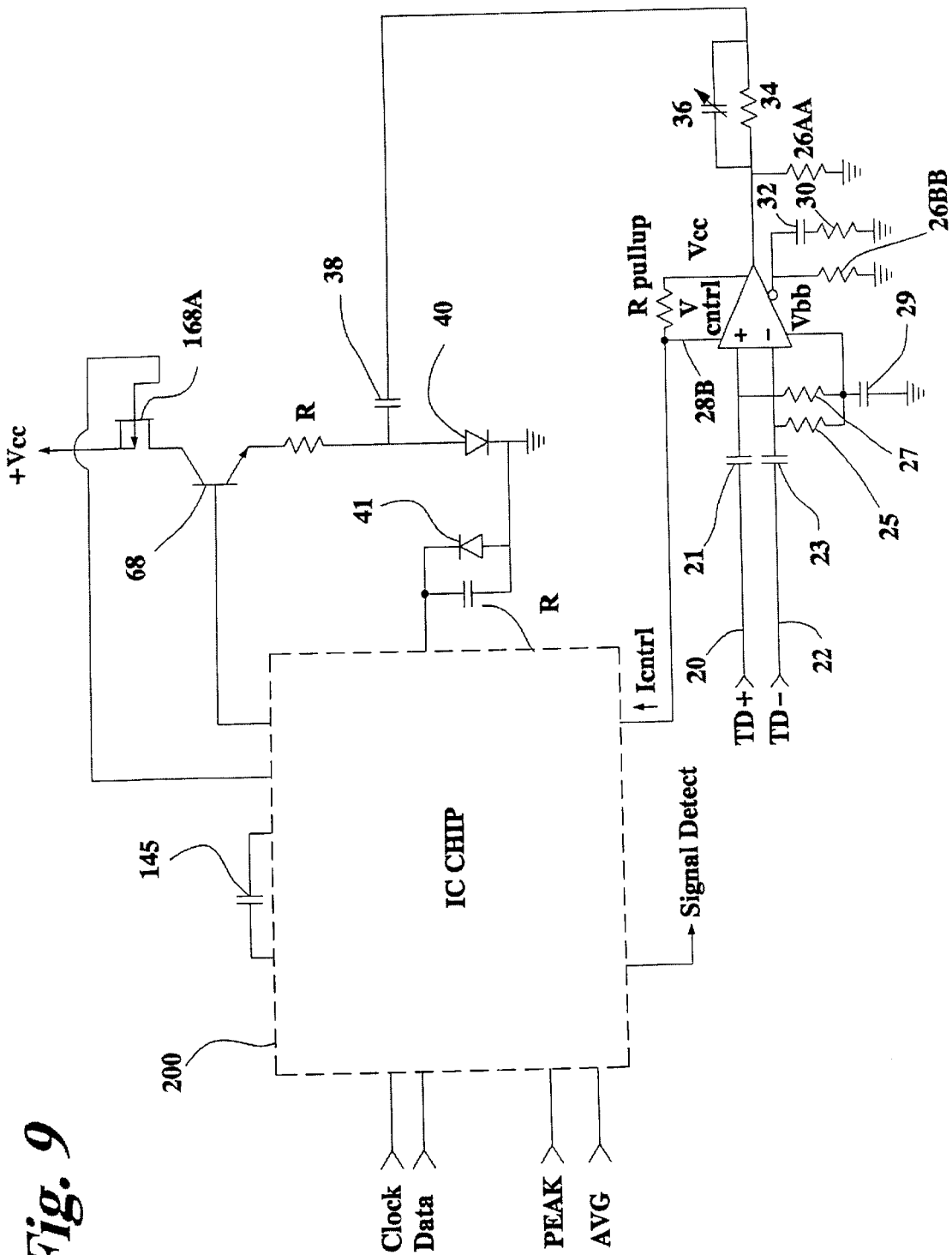
FIG. 9 is a circuit diagram illustrating the components of the present invention to be preferably incorporated into an integrated circuit (IC) chip, as also diagramed in FIG. 6.

FIG. 9 illustrates components of the present invention incorporated into an integrated circuit (IC) chip 200. The internal components of IC 200 relevant to the present invention are illustrated in FIG. 6. FIG. 9 further illustrated how the IC 200 is incorporated into the surrounding circuitry of the present invention.

FIG. 10 illustrates the voltage swing for the variable output voltage driver (shown in FIG. 8) in percentage peak-to-peak differential as a function of the control voltage. This diagram is provided for reference.

As stated, attached to the non-inverting input of the op amp 44 is the wiper terminal VW of a digitally controlled potentiometer which provides means for setting the operating power of the laser. Also capacitor 54 is connected to the op amp non-inverting input. This capacitor 54 prevents high frequency monitor diode signals from coupling into the op amp 44. High frequency signals which are above the operating frequency range of the op amp 44 could be rectified, and if not filtered might produce an undesirable error signal in the output of op amp 44. In the preferred embodiment, the digitally controlled potentiometer 112 operates as a resistor array which consists of 99 resistive elements with tap points being located between each resistive element and accessible by the wiper.

As shown in FIG. 5, the position of the wiper is controlled by the chip select input –CS (pin 7), up/down input U/–D (pin 2), and increment input –INC (pin 1) of the digital potentiometer 112. In the discrete circuit embodiment of FIG. 4, the increment input –INC and the up/down input U/–D are unconnected except during the programming of the device. Additionally, the chip select input –CS is connected to a pull-up resistor which is connected to +5 volts.

As shown in FIG. 5, the digitally controlled potentiometer 52 also has a high terminal VH (pin 3) and a low terminal VL (pin 6) which are equivalent to the fixed terminals of a mechanical potentiometer as shown in the schematic of FIG. 5. When the mechanical potentiometer is replaced by a digital potentiometer in the preferred embodiment, before the laser transmitter 1 is ready to begin transmitting data, the bias current to the laser diode 40 must initially be set. The laser diode 40 output power level is set by adjusting the resistance of the potentiometer 52. To adjust the wiper resistance of the second potentiometer 52, the device 52 is selected by pulling the potentiometer's chip select −CS input to a low logic level. Once the −CS input is pulled low, the −INC input is used to either increase or decrease the resistance at the wiper terminal VW, while the output power of the laser diode is monitored by a calibrated power meter. Correspondingly, the resistance is increased by pulling the U/−D input to a high logic level and, conversely, the resistance is decreased by pulling the U/−D input to a low logic level. This procedure allows the operator to set the laser output power level via control of the digital potentiometer 52.

Once the laser power is selected, the resistor 122B is allowed to pull the chip select input −CS of the second potentiometer 52 to a high logic level. Furthermore, in the preferred the embodiment, the potentiometer 52 has a non-volatile memory so that it is capable of storing the position of the wiper. Therefore, the same wiper position will be maintained upon a subsequent power-on operation.

Correspondingly, in a preferred embodiment, the position of the wiper in the potentiometer 52 is pre-set by its manufacturer so that the highest resistance value is provided, via the wiper terminal VW, when power is first applied to the potentiometer 52. Therefore, minimal bias current is supplied to laser diode 40 when power is first applied to the APC 16.

In the preferred embodiment, the optical power output of the laser diode 40 is measured by conventional means as known by those persons skilled in the art. Furthermore, since the optical power of the laser diode 40 corresponds to the feedback supplied by the monitor diode 40, the potentiometer 52 allows for the APC 16 to be adjusted so that it provides a specific bias current which corresponds directly to the feedback monitor current $I_m$.

Using the digitally controlled potentiometer 52 to adjust the voltage of the reference input signal, and thus the bias current $I_Q$ supplied by the APC, will eliminate the possibility of accidentally destroying the laser diode 40 and provides for a stable means of setting the laser output power. The laser output power can be effectively set since the resistance of the potentiometer 52 cannot be adjusted without supplying toggled signals to the −INC input. Therefore, the reference input signal, and thus the corresponding optical power output of the laser diode 40, cannot be accidentally adjusted since only deliberate steps will cause changes to the voltage level of the reference input signal.

In addition, the use of a second digital potentiometer 52 allows for the automatic adjustment of the monitor current setpoint and therefore the laser output power. Automatic adjustments can be accomplished by having a device, such as a properly calibrated optical power meter traceable to the standards established by the National Institute of Standards and Technology (NIST), receive the optical output power from the laser diode 40 and, based on the level of optical output power measured, a device such as a computer or microprocessor can transmit control signals to the potentiometer 52 to either increase or decrease the optical power output of the laser diode 40 accordingly.

Operationally, the power stabilization circuit 3 will either increase or decrease the bias current supplied to the laser diode 40 depending, respectively, on if the feedback monitor current signal $I_m$ supplied by the photodiode 41 is too low or too high. As depicted in FIG. 4 and indicated above, the feedback monitor current signal effectively governs the inverting input received by the op amp 44. In addition, the voltage level at the non-inverting input of op amp 44 (i.e., the reference input signal) is determined by the product of the monitor current and the potentiometer 52 resistance as described above. Therefore, a comparison of the feedback signal $I_m$ ($R_{SET}$) and the reference input signal determines the output voltage level of op amp 44.

Consequently, the NPN transistor 68 will increase the bias current on line 33 to the laser diode 40 as the output voltage level of the op amp increases due to the feedback signal being too low. Likewise, the transistor 68 will decrease the bias current to the laser diode 40 as the output voltage level of the op amp 44 decreases due to the feedback signal $I_m$ being too high.

It should be noted that the bias current on line 33 supplied by the collector of transistor 68 will only be gradually changed due to the RC time constant provided by R (50) and C (63) connected to op amp 44. Furthermore, as stated above, the feedback monitor current $I_m$ generated by the photodiode 41 will vary directly with changes in the optical power being generated by the laser diode 40.

Consequently, the use of analog circuitry in the APC 16 as described above provides for the compensation of power fluctuations in the output of a laser diode 40.

Once the resistance of the digital potentiometer 52 is set to the correct level, the AC driver 12A (LSC) and laser 40 are ready to convert electrical data input signals TD+ into optical data output signals. As shown in FIG. 4, the AC driver 12A receives differential data input signal via inputs TD+ and TD−.

Output pin 26B of the differential receiver 26 is terminated by resistor 30 and capacitor 32. Likewise, output pin 26A of the differential receiver 26 is attenuated by resistor 34 and capacitor 36 acts as a speedup element to create a pre-emphasis on the digital current pulse to laser 41. Furthermore, the output provided by pin 26A is AC coupled by capacitor 38 so that only the AC component of the output signal, which directly corresponds to the electrical signal received by the AC driver, is superimposed onto the bias current signal used to drive the laser diode 41. Therefore, the optical power output of the laser diode 41 will vary in accordance with the electrical signals received by the AC driver and will be transmitted as data output over an optical medium such as an optic fiber.

It should be understood that various changes and modifications to the presently preferred embodiments described herein will be apparent to those skilled in the art. Such changes and modifications may be made without departing from the spirit and scope of the present invention and without diminishing its attendant advantages.

We claim as our invention:

1. A laser transmitter circuit, comprising:
   a variable voltage driver having an output and a control input;
   a laser diode;
   a resistor connected in series between the output of the variable voltage driver and the laser diode for converting output voltage from the variable voltage driver into a variable AC current drive signal to the laser diode;
   a potentiometer connected to the control input of the variable voltage driver; and
   an automatic power control circuit (APC) for setting and controlling power emitted by the laser diode.

2. The laser transmitter of claim 1, further comprising:
a capacitor connected in parallel with the resistor.

3. The laser transmitter of claim 2, wherein the capacitor is a variable capacitor which functions to speed up rise and fall times of the variable AC current signal to the laser diode.

4. The laser transmitter of claim 1, wherein the potentiometer is a digital potentiometer.

5. The laser transmitter of claim 1, wherein the variable voltage driver includes an Arizona Microtek AZM100EL16VS.

6. The laser transmitter of claim 1, wherein the resistor connected in series with the output of the variable voltage driver converts output voltage of the variable voltage driver into a variable AC current drive signal.

7. The laser transmitter of claim 1, wherein the resistor connected in series between the output of the variable voltage driver and the laser diode functions to create a variable AC laser diode current signal, and the laser diode is responsive to the variable AC laser diode current signal for lasing and thereby producing an optical data output signal.

8. A laser transmitter, comprising:
a variable voltage driver having an output and a control input;
a laser diode;
a resistor connected in series between the output of the variable voltage driver and the laser diode;
a variable voltage controller connected to the control input of the variable voltage driver; and
an automatic power control circuit (APC) for setting and controlling average power emitted by the laser diode.

9. The laser transmitter of claim 8, wherein the variable voltage controller includes a potentiometer connected to the control input.

10. The laser transmitter of claim 9, wherein the potentiometer is a digital potentiometer.

11. The laser transmitter of claim 9, wherein the variable voltage controller includes a pull-up resistor connected to a variable current source.

12. The laser transmitter of claim 8, further comprising:
a capacitor connected in parallel with the resistor.

13. The laser transmitter of claim 12, wherein the capacitor is a variable capacitor.

14. The laser transmitter of claim 8, wherein the variable voltage controller and the APC are configured into an integrated circuit.

15. A laser transmitter, comprising:
a voltage driver having an output;
a laser diode;
a resistor connected in series between the output of the voltage driver and the laser diode;
an automatic power control (APC) for setting and controlling the laser diode output power;
a first digital potentiometer connected to the APC so as to set output power of the laser diode; and
a digital shift register with a serial input and parallel outputs, wherein the parallel outputs are connected to the digital potentiometer for setting the resistance of said digital potentiometer.

16. The laser transmitter of claim 15, wherein said voltage driver is a variable voltage driver, said laser transmitter further comprising:
a variable voltage control connected to said voltage driver; and
a second digital potentiometer connected to said variable voltage control so as to produce a variable output control voltage.

17. The laser transmitter of claim 15, wherein the APC includes the first digital potentiometer.

18. The laser transmitter of claim 15, wherein the automatic power control (APC), the first digital potentiometer, and the digital shift register are configured into an integrated circuit.

19. The laser transmitter of claim 15, further comprising:
a laser fault latching circuit for monitoring output power emitted by the laser diode; and
a laser disable circuit for preventing current flow to the laser diode when excess output power is detected.

20. The laser transmitter of claim 1, wherein the laser diode is capable of transmitting greater than 100 megabits of data per second.

21. The laser transmitter circuit of claim 1, wherein the potentiometer is a digital potentiometer including an EEPROM (Electrically-Erasable Programmable Read-Only Memory).

22. The laser transmitter circuit of claim 1, wherein the potentiometer is a digital potentiometer including an EEPROM (Electrically-Erasable Programmable Read-Only Memory) and a shift register.

23. A laser transmitter, comprising:
a variable voltage driver having an output and a control input;
a laser diode;
a resistor connected in series between the output of the variable voltage driver and the laser diode;
a control voltage generating circuit connected to the control input of the variable voltage driver; and
an automatic power control circuit (APC) for setting and controlling power emitted by the laser diode.

24. The laser transmitter of claim 23, wherein the control voltage generating circuit includes a potentiometer.

25. The laser transmitter of claim 24, wherein the potentiometer is a digital potentiometer.

26. The laser transmitter of claim 25, wherein the digital potentiometer includes an EEPROM (Electrically-Erasable Programmable Read-Only Memory).

27. The laser transmitter of claim 26, wherein the digital potentiometer includes a shift register.

* * * * *

UNITED STATES PATENT AND TRADEMARK OFFICE
CERTIFICATE OF CORRECTION

PATENT NO. : 6,711,189 B1
DATED : March 23, 2004
INVENTOR(S) : Gilliland et al.

It is certified that error appears in the above-identified patent and that said Letters Patent is hereby corrected as shown below:

<u>Title page,</u>
Item [75], Inventors, add -- David Schie --.

Signed and Sealed this

Thirty-first Day of August, 2004

JON W. DUDAS
*Director of the United States Patent and Trademark Office*